United States Patent
Sharma et al.

(10) Patent No.: US 7,191,427 B2
(45) Date of Patent: Mar. 13, 2007

(54) METHOD FOR MAPPING A LOGIC CIRCUIT TO A PROGRAMMABLE LOOK UP TABLE (LUT)

(75) Inventors: Sunil Kumar Sharma, Uttar Pradash (IN); Ajay Tomar, Uttar Pradesh (IN); Dhabalendu Samanta, Delhi (IN)

(73) Assignee: STMicroelectonics PVT Ltd., Uttar Pradesh (IN)

( * ) Notice: Subject to any disclaimer, the term of this patent is extended or adjusted under 35 U.S.C. 154(b) by 334 days.

(21) Appl. No.: 10/830,862

(22) Filed: Apr. 23, 2004

(65) Prior Publication Data

US 2005/0039157 A1    Feb. 17, 2005

(30) Foreign Application Priority Data

Apr. 25, 2003    (IN) .............................. 632/DEL/03

(51) Int. Cl.
    *G06F 17/50* (2006.01)
(52) U.S. Cl. .......................................... 716/17; 716/18
(58) Field of Classification Search ..................... None
    See application file for complete search history.

(56) References Cited

U.S. PATENT DOCUMENTS

| | | | |
|---|---|---|---|
| 6,134,705 A * | 10/2000 | Pedersen et al. | 716/18 |
| 6,195,788 B1 * | 2/2001 | Leaver et al. | 716/18 |
| 6,336,208 B1 | 1/2002 | Mohan et al. | 716/16 |
| 6,871,328 B1 * | 3/2005 | Polk | 716/1 |
| 2004/0133869 A1 * | 7/2004 | Sharma | 716/16 |

OTHER PUBLICATIONS

A.H.Farrahi et al., "Complexity of the Lookup-Table Minimization Problem for FPGA Technology Mapping," IEEE Transactions on CAD of ICs and Systems, vol. 13, No. 11, Nov. 1994, pp. 1319-1332.*

Kuang-Chien Chen et al., "DAG-Map: Graph-Based FPGA Technology Mapping for Delay Optimization", IEEE Design and Test Computers, Sep. 1992, pp. 7-20.

Jason Cong et al., "An Optimal Technology Mapping Algorithm for Delay Optimization in Lookup-Table Based FPGA Designs", UCLA Computer Science Dept. Technical Report CAD, vol. 13, pp. 1-7, Jan. 1994.

(Continued)

*Primary Examiner*—Leigh M. Garbowski
(74) *Attorney, Agent, or Firm*—Lisa K. Jorgenson; Allen, Dyer, Doppelt, Milbrath & Gilchrist, P.A.

(57) ABSTRACT

The method for mapping a logic circuit to a plurality of interconnectable, programmable look up tables (LUT) elements includes forming logic element groups including individual logic elements and/or previously formed logic element groups that are capable of being accommodated within the fanin and/or fanout capacity of a target LUT. The method further includes mapping the formed logic element group to the target LUT, and repeating the process for forming logic element groups and mapping to target LUTs for the entire network in a manner such that at each stage only the unmapped logic element/elements and mapped logic element groups of the previous stage are considered for mapping.

10 Claims, 4 Drawing Sheets

OTHER PUBLICATIONS

Jason Cong et al., "On Area/Depth Trade-off in LUT-Based FPGA Technology Mapping", UCLA Computer Science Dept. 30th ACM/IEEE Design Automation Conference (DAC), 1993, pp. 213-218.

Jason Cong et al., "Beyond the Combinatorial Limit in Depth Minimization for LUT-Based FPGA Designs", IEEE/ACM International Conference on Computer-Aided Design, Nov. 1993, pp. 110-114.

Francis et al., " Chortle-crf: Fast Technology Mapping for Lookup Table-Based FPGAs", University of Toronto, CA 28th ACM/IEEE Design Automation Conference, 1991, pp. 227-233.

Francis et al., "Technology Mapping of Lookup Table-Based FPGAs for Performance". Dept. of Electrical Engineering, University of Toronto, CA, IEEE Feb. 1991, pp. 568-571.

* cited by examiner

METHOD FOR MAPPING A LOGIC CIRCUIT TO A PROGRAMMABLE LOOK UP TABLE (LUT)

FIELD OF THE INVENTION

The present invention relates to Field Programmable Gate Arrays (FPGA), and, more particularly, to methods for mapping a logic circuit to a programmable look up table.

BACKGROUND OF THE INVENTION

A programmable logic array device has a plurality of logic elements connected through an interconnect architecture. Electrical circuits are mapped over these logic elements to allow the device to perform desired operations. Mapping of an electrical circuit to an FPGA is a time consuming process, and thus it is desired to increase the speed of the mapping process.

The important objectives during mapping of an electrical circuit over an FPGA are, to map the maximum number of circuit elements over a single logic element and to achieve the smallest possible tree of logic elements to realize the electrical circuit. Different technologies propose different methods for achieving these objectives. For example, R. J. Francis et al. in "Chortle-crf: Fast Technology Mapping for Lookup Table-Based FPGAs", University of Toronto, CA $28^{th}$ ACM/IEEE Design Automation Conference, 1991, pp. 227–233, proposes a mapping algorithm that reduces delay by using bin packing to determine the gate level decomposition of every node in the network.

Another method suggested by K. C. Chen et al. in "DAG-Map: Graph-Based FPGA Technology Mapping for Delay Optimization", IEEE Design and Test of Computers, September 1992, pp. 7–20, uses a graph based technology mapping package for delay optimization in logic elements. In this technology mapping is carried out in three main parts, transformation of an arbitrary network into a two input network technology mapping for delay minimization, and area optimization in the mapping approach through a direct acyclic graph (DAG).

A polynomial time technology mapping algorithm has been proposed by J. Cong, and Y. Ding in "An Optimal Technology Mapping Algorithm for Delay Optimization in Look-up Table Based FPGA Designs", IEEE Transactions on Computer-Aided Design of Integrated Circuits and Systems, pages 1–12, January 1994, in which a Flow-Map that optimally maps an electrical circuit on an FPGA for depth minimization by computing a minimum height for k-feasible cut an a network. This process is commonly used for technology mapping. The process can be better understood by referring to the flowchart shown in FIG. 1.

FIG. 1 shows a flow diagram of the process. According to this process, in the first step, the gate level Net-list 1.1 containing information about the logic gates is inserted for mapping onto the LUTs in the FPGA. Now supposing that N denotes the given network of logic gates contained in the Net-list and $N_t(v)$ denotes a sub-network generated at a node v, the next step is to generate sub-network $N_t(v)$ at each node v 1.2 of the network N. The sub-network $N_t(v)$ contains the node v itself along with all the transitive fanins of node v including the primary inputs. Next, k-distinct paths are found in the sub-network $N_t(v)$ by applying known techniques such as depth first, breadth first search and the like. Subsequently, a minimum height k-feasible cut is found in the sub-network $N_t(v)$ 1.3 starting from v until the primary inputs and LUTs are formed. The next step followed in the process is to level each gate of the design 1.4 and subsequently, map the given design starting from the primary output towards the primary inputs 1.5 onto a LUT.

FIG. 2 shows the generation of sub-networks $N_t(v)$ using the process discussed above. In this process at each node v of the network N, in the given figure, sub-network $N_t(\mathbf{12})$ generated at the node 12 starts from node 12 and continues until the primary nodes 1, 2, 3, 4 and 5. Thus, the sub-network can be mathematically represented as $N_t(12)=\{12, 11, 10, 9, 8, 7, 6, 5, 4, 3, 2, 1\}$ as it includes all the transitive fanins of node v, including the primary inputs. A four input LUT is formed at node 12 for the sub-network $N_t(v)$. Nodes inside the cone are 10, 11 and 12, while the fanin nodes of the cone are 6, 7, 8 and 9.

Another research article by J. Cong et al. in "On Area/Depth Trade-off in LUT-Based FPGA Technology Mapping", UCLA Computer Science Dept., $30^{th}$ ACM/IEEE Design Automation Conference (DAC), 1993, pp. 213–218, suggests a process for FPGA mapping technology. In this technique a number of depth relaxation operations are performed to obtain a new network with bounded increase in depth and is advantageous to subsequent re-mapping for area minimization by gradually increasing depth bound.

An integrated approach for synthesizing and mapping has been disclosed by Francis, et. al. in "Technology Mapping of Lookup Table-Based FPGAs for Performance", Dept. of Electrical Engineering, University of Toronto, CA, IEEE February 1991, pp. 568–571. This process uses a global combinatorial optimization technique to guide the Boolean synthesis process during depth minimization. The combinatorial optimization is achieved by computing a series of minimum cuts of fixed heights in a network based on fast network computation, and the Boolean optimization is achieved by efficient Ordered Binary Decision Diagrams (OBDD) based implementation of functional decomposition.

In another approach by Francis, et al., a process has been discussed for technology mapping including a new method for choosing gate level decompositions based on binary packing. Several other approaches have also been applied to achieve these objectives. However, most of these approaches result in either local optimal or exponential time complexity. Hence, these approaches are too expensive and cannot be applied for all designs.

One of the ways for achieving this reduction of sub-network includes: Starting from the node v and including all nodes until the k-feasible cut is found; and Considering node v as $0^{th}$ level node, including all nodes up to a certain level, e.g. 4 or 5. Such reduction techniques do not give an optimal solution or even a near optimal solution.

The Flow-diagram process described above suffers from a drawback, that the runtime of the process gets increased while constructing sub-networks and finding a cut for each node of the circuit. This increase becomes even more prominent when the delay of a circuit increases.

SUMMARY OF THE INVENTION

An object of this invention is to overcome the above drawbacks in the prior art and provide a method for LUT based mapping for reducing computation time taken and providing a near depth optimal mapping approach.

To achieve the above and other objects, the invention provides a method for mapping a logic circuit to a plurality of interconnectable, programmable look up table (LUT) elements comprising: forming logic element groups including individual logic elements and/or previously formed logic element groups that are capable of being accommodated within the fanin and/or fanout capacity of a target LUT; mapping the formed logic element group to the target LUT, and; repeating the process for forming logic element groups and mapping to target LUTs for the entire network in a manner such that at each stage only the unmapped logic element/elements and mapped logic element groups of the previous stage are considered for mapping.

The invention also provides a method that provides an ability to incorporate mapped logic elements groups up to any desired previous levels for the mapping to the target LUT.

BRIEF DESCRIPTION OF THE DRAWINGS

The objects and advantages of the invention will become more apparent with reference to the following description and accompanying drawings, wherein.

DETAILED DESCRIPTION OF THE PREFERRED EMBODIMENTS

Figure 1:
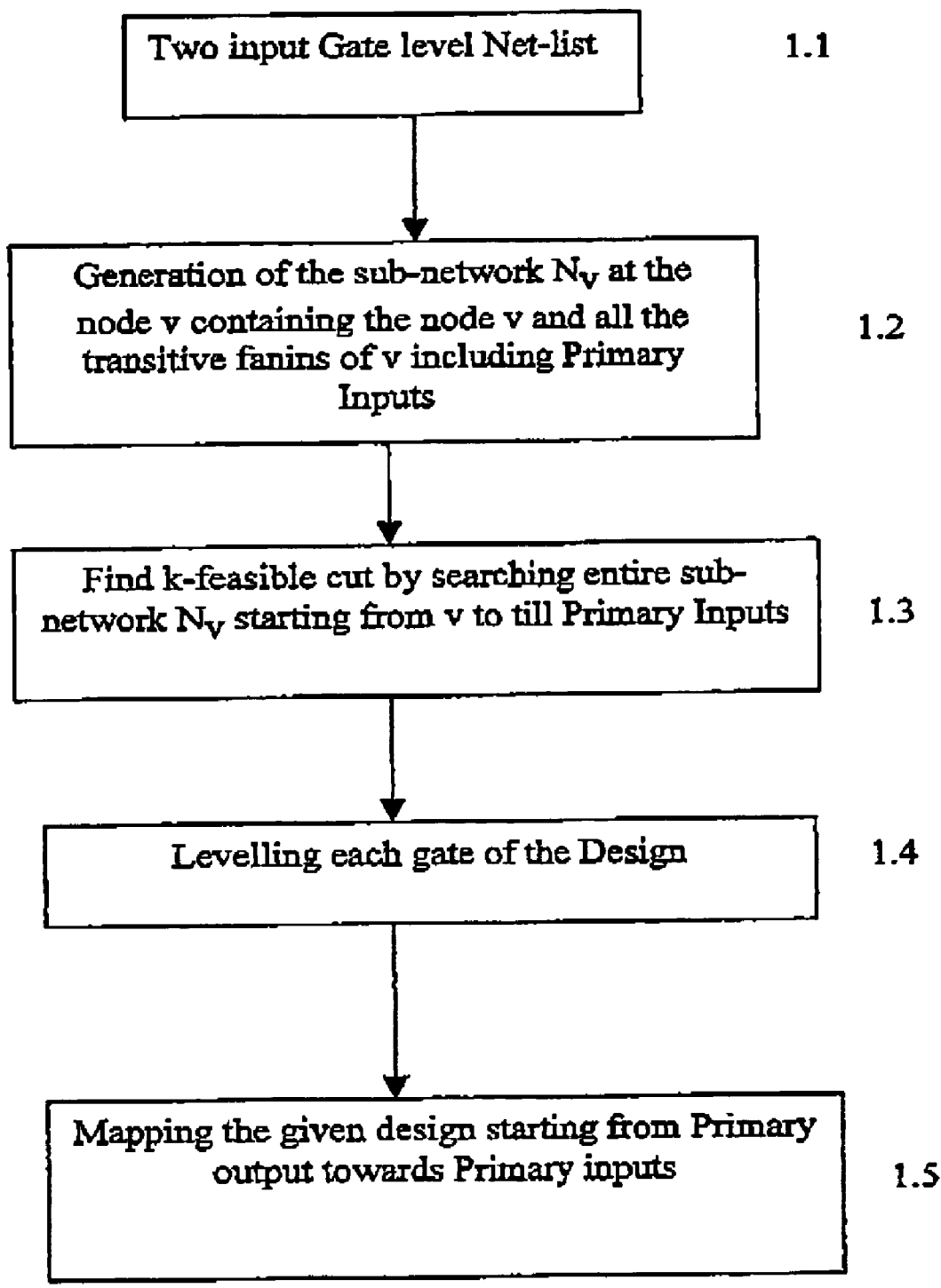
FIG. 1 is a flowchart depicting steps in the conventional process for LUT mapping.
Figure 2:
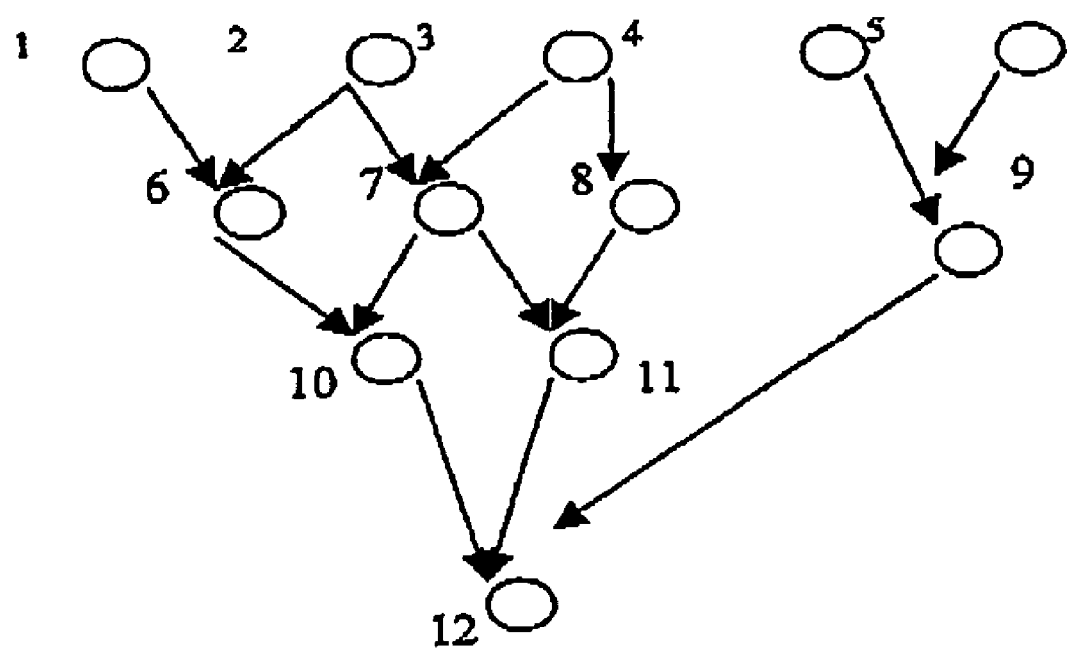
FIG. 2 is a schematic diagram showing the generation of sub-networks at each node v of the network N representing all logic gates to be mapped in accordance with the process of FIG. 1.

FIG. 1, and FIG. 2 have already been described in the background of the invention.

Figure 3:
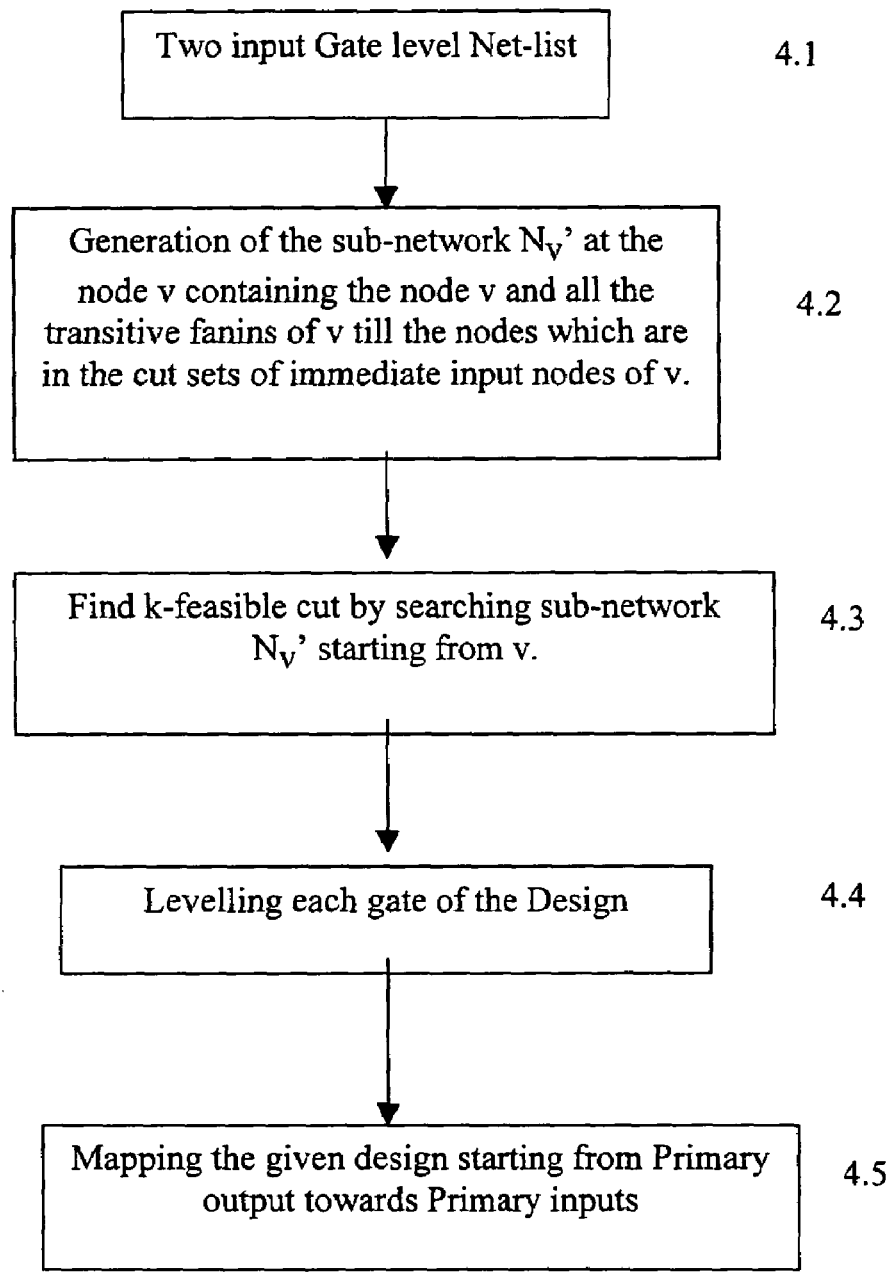
FIG. 3 is a flowchart for use in describing the process of the present invention for LUT mapping.

FIG. 3 shows the process/algorithm depicting the steps provided by the present invention for LUT mapping. First, the gate level Net-list is input for providing information about the logic gates to be mapped 4.1. The next step 4.2 is the generation of the sub-network $N_t(v)$ at node v containing the node v itself along with all the transitive fanins of v until the nodes which are in the cut sets of immediate input nodes of v. This step is an improvement over the conventional mapping methods as it significantly reduces the number of nodes to be considered for mapping each time a new node is to be mapped. Further, in step 4.3 the k-feasible cut is found out for the sub-network $N_t(v)$ by searching the sub-network starting from node v.

In the present method for constructing sub-network $N_t(v)$ for each node v of the network N, let $v_1$ be a node for which all fanins are primary inputs. Sub-network $N_t(v)$ includes primary inputs, which have a path to v and v itself. For constructing sub-network $N_t(v)$ at any node v of the network N, Let $X=\{x_1, x_2, \ldots, x_m\}$ be the set of immediate fanin nodes of a node v.

Let $C_i=\{x_i^1, x_i^2, \ldots, x_i^k\}$ (i=1, 2, \ldots, m) be the k-feasible cut of the sub-network $N_t(x_i)$ generated at the node $x_i$.

Figure 4:
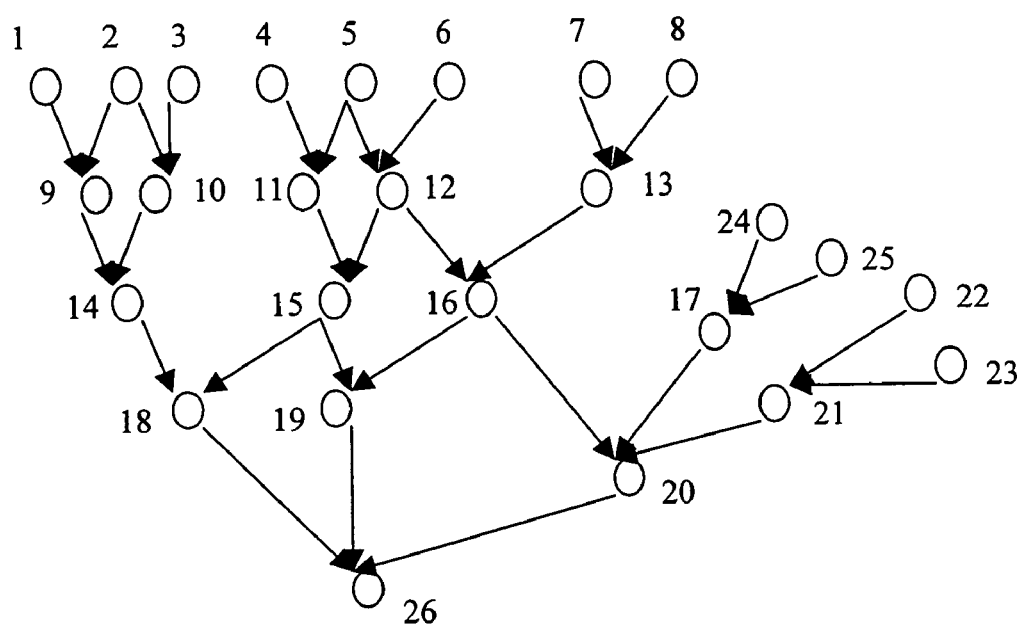
FIG. 4 is a schematic diagram showing the generation of sub-networks according to the method of the present invention.

Then $N_t(v)$ includes of all nodes in $C_1, C_2, \ldots, C_m$ and all transitive fanouts of nodes in $C_1, C_2, \ldots, C_m$ which have path to v as shown in FIG. 4.

In FIG. 4, suppose sub-networks $N_t(18)$, $N_t(19)$, $N_t(20)$ have already been constructed and the sub-network $N_t(26)$ has to be generated next at node 26. Further, suppose that number of inputs to each LUT is 4. The sets of fanin nodes for the sub-networks $N_t(18)$, $N_t(19)$, $N_t(20)$ are {9, 10, 11, 12}, {4, 5, 6, 13} and {12, 13, 17, 21} respectively.

If the sub-network $N_t(26)$ is generated by following the steps of the conventional mapping process, then $N_t(26)$ will contain all nodes till the primary inputs. In mathematical terms $N_t(26)=\{1, 2, 3, \ldots, 24, 25, 26\}$.

On the other hand, when the sub-network $N_t(26)$ is generated using the method of the present invention, then it starts from node 26 and spans up to nodes for which the set of immediate fanins is the set: {9, 10, 11, 12}∪{4, 5, 6, 13}∪{12, 13, 17, 21}={9, 10, 11, 12, 4, 5, 6, 13, 17, 21}. Therefore, according to this invention, the set of nodes that are not required to construct $N_t(26)$ is {1, 2, 3, 4, 5, 6, 7, 8, 22, 23, 24, 25}.

As a result of this reduction in the number of nodes, the computational time taken gets reduced by about 50% as compared to the conventional method. At the same time, this method provides a near depth optimal mapping solution. Moreover, for a circuit having delay, the execution time saving will be even more. This execution time saving may vary from x to 4x times. Results of this invention on a few benchmark circuits for LUT formation have been tabulated in Table 1. Columns 2 and 3 of Table 1 are results for the conventional Flow-map process, while Columns 4 and 5 are results for the method of the present invention.

TABLE 1

| | Flow-map | | Proposed method | |
| --- | --- | --- | --- | --- |
| Design | Depth | Time (seconds) | Depth | Time |
| Alu2 | 11 | 4.61 | 11 | 1.25 |
| Alu4 | 7 | 27.68 | 7 | 19.59 |
| Apex2 | 8 | 51.505 | 8 | 27.39 |
| Apex3 | 7 | 10.485 | 7 | 5.39 |
| B12 | 6 | 3.49 | 6 | 2.6 |
| C1355 | 4 | 33.848 | 5 | 3.4 |
| C499 | 4 | 11.847 | 5 | 1.4 |
| Count | 6 | .5 | 6 | .2 |
| Duke2 | 5 | 1.8 | 5 | 1.05 |
| Ex5p | 7 | 35.53 | 7 | 9.93 |
| i8 | 6 | 27.87 | 6 | 18.7 |
| i9 | 5 | 12.99 | 6 | 4.5 |
| Misex3 | 7 | 46.03 | 7 | 37.99 |
| S1196 | 7 | 4.19 | 7 | 2.16 |
| S1423 | 18 | 7.98 | 18 | 1.96 |
| S838 | 14 | 2.82 | 14 | 1.31 |
| S8381 | 6 | 2.96 | 6 | 1.16 |
| S1238 | 7 | 4.14 | 7 | 2.06 |
| Dalu-opt | 6 | 3.22 | 6 | 1.66 |
| Vg2 | 5 | 1.39 | 5 | .14 |
| X3 | 6 | 6.609 | 6 | 5.5 |
| Table5 | 7 | 7.01 | 7 | 2.8 |
| Table3 | 6 | 7.1 | 6 | 2.9 |
| TOTAL | | 315.604 | | 152.14 |

Average Reduction in time=((315.604−152.14)/ 315.604)*100%=51.794%.

The description of the present invention has been presented for purposes of illustration and is not intended to be exhaustive or limited to the invention in the form disclosed. Many modifications and variations will be apparent to those of ordinary skill in the art.

The invention claimed is:

1. A method for mapping a logic circuit, including a network of logic elements and nodes, to a plurality of interconnectable, programmable look up table (LUT) elements, the method comprising:
   forming logic element groups including at least one of individual logic elements and previously formed logic element groups that are within at least one of a fanin and fanout capacity of a target LUT;

mapping the formed logic element group to the target LUT; and performing stages including repeating the forming and mapping for the entire logic circuit in a manner that at each stage unmapped logic elements and mapped logic element groups of a previous stage are considered for mapping.

2. A method as claimed in claim 1 wherein mapping to the target LUT includes using mapped logic element groups of a selected previous stage.

3. A method as claimed in claim 1 wherein forming logic element groups includes inputting information about the logic elements to be mapped.

4. A method as claimed in claim 3 wherein forming logic element groups further includes generating a sub-network at a selected node including the selected node and transitive fanins of the selected node up to nodes in a cut set of immediate input nodes of the selected node.

5. A method as claimed in claim 4 wherein forming logic element groups further includes searching the sub-network starting from the selected node to find a feasible cut.

6. A method for mapping a logic circuit, including a network of logic elements and nodes, to a plurality of interconnectable, programmable look up table (LUT) elements, the method comprising;

forming logic element groups including at least one of individual logic elements and previously formed logic element groups that are within at least one of a fanin and fanout capacity of a target LUT; and mapping the formed logic element group to the target LUT;

wherein forming and mapping include using unmapped logic elements and mapped logic element groups.

7. A method as claimed in claim 6 wherein mapping to the target LUT includes using mapped logic element groups of a selected previous mapping stage.

8. A method as claimed in claim 6 wherein forming logic element groups includes inputting information about the logic elements to be mapped.

9. A method as claimed in claim 6 wherein forming logic element groups includes generating a sub-network at a selected node including the selected node and transitive fanins of the selected node up to nodes in a cut set of immediate input nodes of the selected node.

10. A method as claimed in claim 9 wherein forming logic element groups further includes searching the sub-network starting from the selected node to find a feasible cut.

* * * * *